US006816986B1

(12) United States Patent
Fanning

(10) Patent No.: US 6,816,986 B1
(45) Date of Patent: Nov. 9, 2004

(54) REMAPPING MEMORY DEVICES DURING OPERATION

(75) Inventor: Blaise Fanning, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/473,483

(22) Filed: Dec. 28, 1999

(51) Int. Cl.[7] .................................................. H02H 3/05
(52) U.S. Cl. ............................................ 714/42; 714/54
(58) Field of Search ................................ 714/42, 54, 5, 714/6, 710, 718, 11, 47

(56) References Cited

U.S. PATENT DOCUMENTS 4,503,535 A * 3/1985 Budde et al. .................. 714/3
4,899,342 A * 2/1990 Potter et al. ................... 714/6
5,418,938 A * 5/1995 Hatanaka et al. ............. 714/11
5,611,069 A * 3/1997 Matoba ...................... 711/114
5,659,678 A * 8/1997 Aichelmann et al. ......... 714/25
5,901,280 A * 5/1999 Mizuno et al. ................ 714/6
6,058,047 A * 5/2000 Kikuchi ................. 365/185.33
6,067,259 A * 5/2000 Handa et al. ............... 365/200

* cited by examiner

*Primary Examiner*—Dieu-Minh Le
(74) *Attorney, Agent, or Firm*—Blakely, Sokoloff, Taylor & Zafman LLP

(57) ABSTRACT

According to the invention, systems, apparatus and methods are disclosed for automatically replacing semiconductor based memory in a system while that system is operating. Replacement is accomplished by blocking access to the memory devices to be swapped, copying the contents of the faulty device to the replacement device, swapping the IDs of the two devices, and re-enabling access to the replaced device. This replacement is triggered by interrupts from the error detection logic. After replacement, the system automatically checks the faulty device to determine its suitability for use as a spare in the future. The determination is made by repeatedly writing and reading a pseudo-random pattern into the device and logging any errors.

35 Claims, 10 Drawing Sheets

REMAPPING MEMORY DEVICES DURING OPERATION

FIELD OF THE INVENTION

This invention relates to computer systems in general, and more specifically to automatically replacing faulty memory devices while the system is operating.

BACKGROUND OF THE INVENTION

Increasingly, computer systems are used in applications which require extremely high levels of availability. Well known examples include network servers, online trading systems, and air traffic control systems. Other applications which require a high degree of availability include embedded systems in industrial controls, medical systems and power distribution equipment.

In order to improve the reliability and availability and to decrease the downtime of such systems, improvements have been made to the I/O systems and secondary storage devices. Among these improvements are examples such as using disk arrays to improve the reliability of these devices and decrease downtime due to disk failures.

Improvements to primary storage devices have been limited. Previously, when a faulty memory device was discovered, access to that device could be avoided by the system until the system was turned off and the device manually replaced. This method reduced drastic system failures but degraded system performance. Therefore, a method of replacing faulty memory devices without degrading system performance would be useful.

SUMMARY OF THE INVENTION

According to one aspect of the invention, a method of automatically replacing a faulty semiconductor based memory device with a spare semiconductor based memory device is provided. This method consists of stalling access requests to both the faulty memory device and the spare memory device, copying the contents of the faulty memory device to the spare memory device, swapping the device ID of the spare memory device for the device ID of the faulty memory device, and re-enabling access to both memory devices.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DETAILED DESCRIPTION

A method and apparatus are described for automatically replacing memory devices. This replacement may be performed by an operating system or by system management firmware in conjunction with hardware and is executed while the system is operating. After replacement, the faulty memory device may be checked to determine its suitability for use as a spare memory device in the future.

In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention includes various steps, which will be described below. The steps of the present invention may be performed by hardware components or may be embodied in machine-executable instructions, which may be used to cause a general-purpose or special-purpose processor or logic circuits programmed with the instructions to perform the steps. Alternatively, the steps may be performed by a combination of hardware and software.

Importantly, while embodiments of the present invention will be described with reference to computer systems and RDRAM comprising one or more RAMBUS® Inline Memory Modules (RIMMs), the method and apparatus described herein are equally applicable to any system containing other types of memory. For example, the techniques described herein are thought to be useful in connection with video game systems and embedded systems used in various applications. Generally, the memory devices used should have a narrow data interface similar to that of the RDRAM so that a multiplicity of spare devices is not required.

Figure 1:
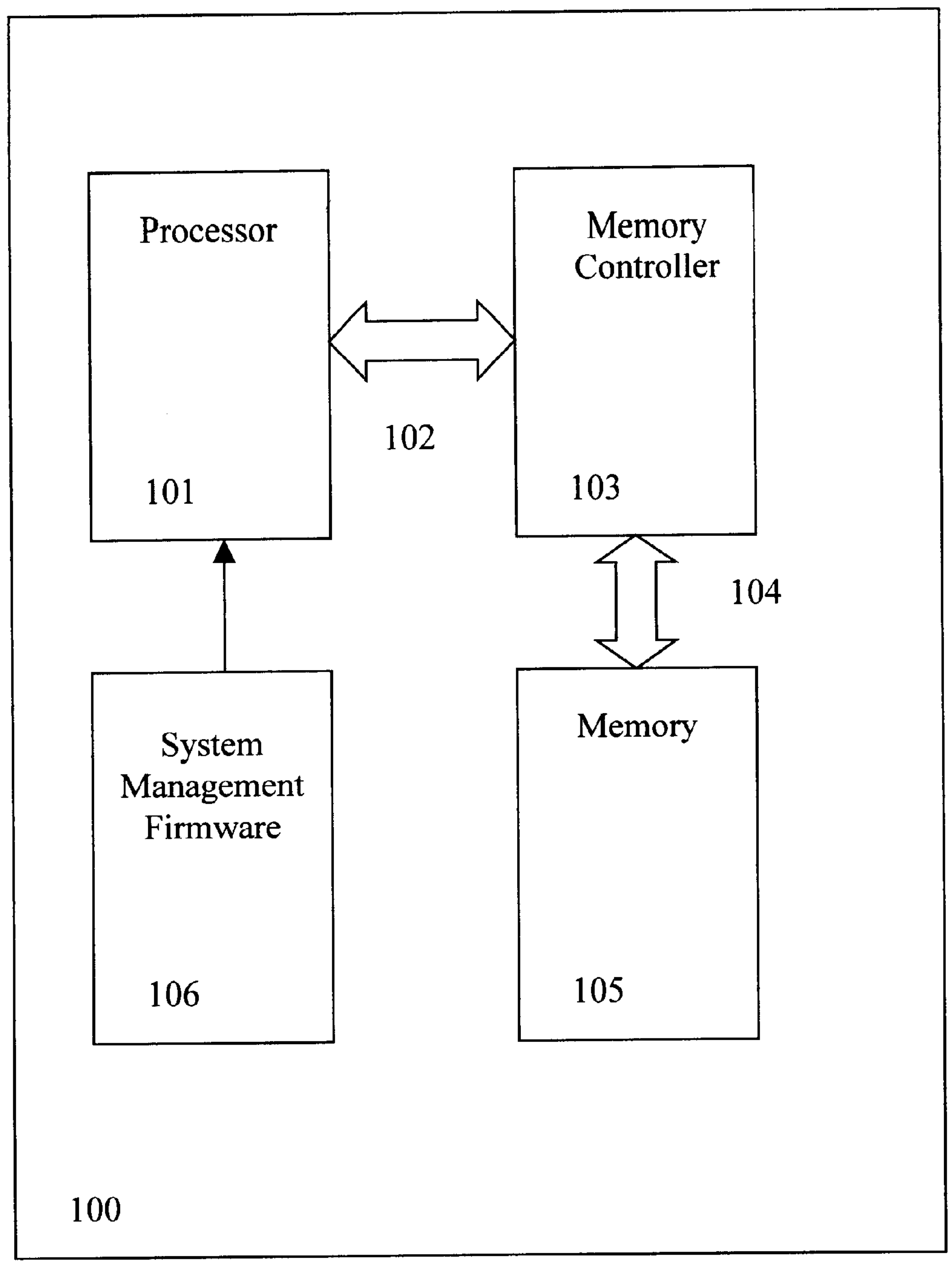
FIG. 1 is a block diagram of a system in which one embodiment of the present invention may be implemented.

FIG. 1 is a block diagram of a system in which one embodiment of the present invention may be implemented. This system 100 consists of a processor 101, a memory controller 103, memory 105, and system management firmware 106 such as a Basic Input Output System (BIOS). The system management firmware 106 typically stored in Read-Only Memory (ROM) is executed by the processor 101 and interacts with the memory controller 103 through the system's bus 102. The memory controller 103 then accesses and manipulates the memory 105.

According to the preferred embodiment of the present invention, the replacement of faulty memory devices can be triggered by interrupts to the system management firmware 106. These interrupts can be caused by either soft errors such as single-bit errors or hard errors such as multi-bit errors detected by standard error detection logic. The replacement of faulty memory devices is then carried out by the system management firmware 106 or the operating system as described further below.

Figure 2:
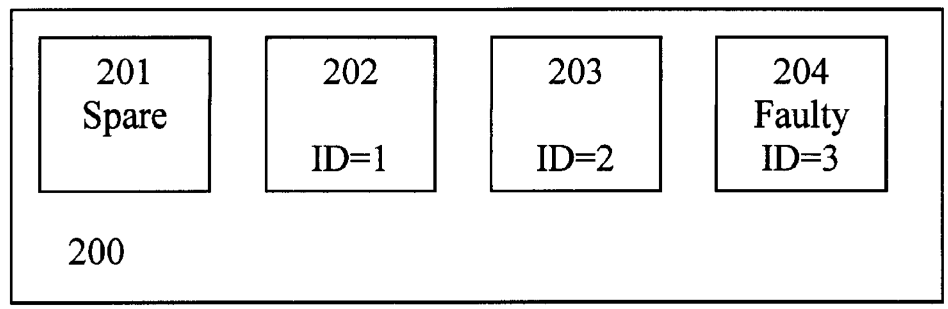
FIG. 2 is a block diagram of one embodiment of the present invention in which one memory device is reserved for use as a spare.

FIG. 2 is a block diagram of one embodiment of the present invention in which one memory device is reserved for use as a spare. Here, the memory module 200, such as a RAMBUS® Inline Memory Module (RIMM), consists of 4 devices 201–204. Device 201 is reserved for use as a spare and is hidden from the operating system. Therefore, device 201 has been assigned no ID. Devices 202, 203 and 204 have been assigned IDs 1, 2, and 3 respectively. In addition, device 204 has been found to be faulty.

Figure 3:
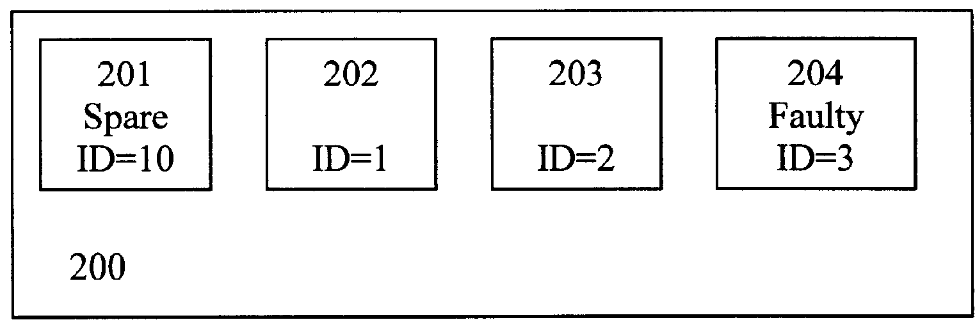
FIG. 3 is a block diagram of one embodiment of the present invention in which one memory device is reserved for use as a spare and one memory device has been determined to be faulty.

According to one embodiment of the present invention, in order to perform the replacement of the faulty device 204 the contents of the faulty device must be copied to the spare device. Before this copy is performed, the spare device 201 is assigned a temporary ID. This process, according to one embodiment of the present invention, is illustrated in FIG. 3. Here, the spare device 201 has temporarily been assigned an ID of 10.

Figure 4:
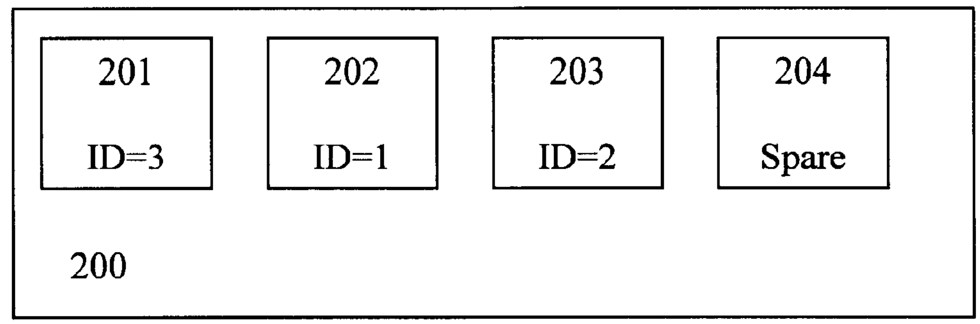
FIG. 4 is a block diagram of one embodiment of the present invention in which a faulty memory device and a spare memory device have been swapped.

According to another embodiment of the present invention, after the contents of the faulty device have been copied to the spare device, the spare device should be assigned the ID of the faulty device and the faulty device should be hidden from the operating system. FIG. 4 is a block diagram of one embodiment of the present invention in which a faulty memory device and a spare memory device have been swapped. Here, the spare device 201 has been assigned the ID of 3 which was the old ID of the faulty device. In addition, the faulty device 204 has no ID, thereby hiding it from the operating system.

According to one embodiment of the present invention, this replacement procedure may be executed by the operating system software. However, this software based method suffers from the fact that it depends upon fairly sophisticated operating system software modifications in order to work and may have negative effects upon system performance.

According to the preferred embodiment of the present invention, the replacement procedure is executed by system management firmware in conjunction with dedicated hardware that avoids involving the operating system. This hardware based method is much more efficient than the software method since it can be accomplished entirely by hardware and system management firmware and can take as little as one third as long to perform. This hardware method also has the advantage of being able to allow access to other memory devices while the replacement process progresses. Both the hardware and software methods will be described below.

Regardless of whether a hardware based method or a software based method is used, varying sized portions of memory may be replaced. For example, an entire memory module such as a RIMM may be replaced if a spare module is available. Alternatively, a single device on a memory module may be replaced as long as a spare device is maintained. Finally, a portion of one device may be replaced in a similar manner.

Figure 5:
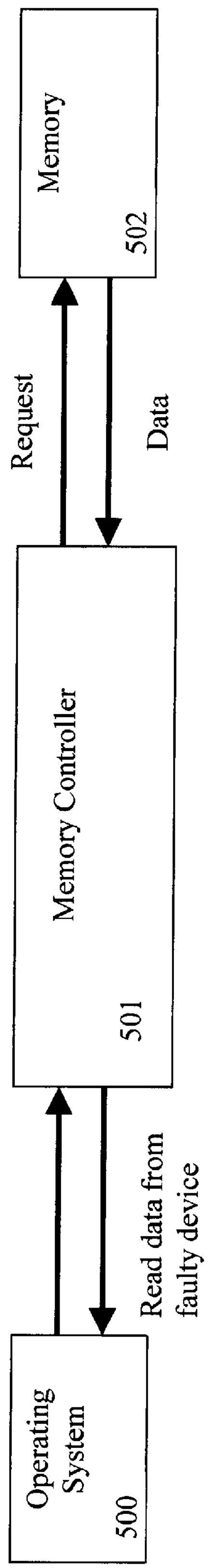
FIG. 5 is a block diagram of a system illustrating an operating system initiating a memory replacement according to one embodiment of the present invention.
Figure 6:
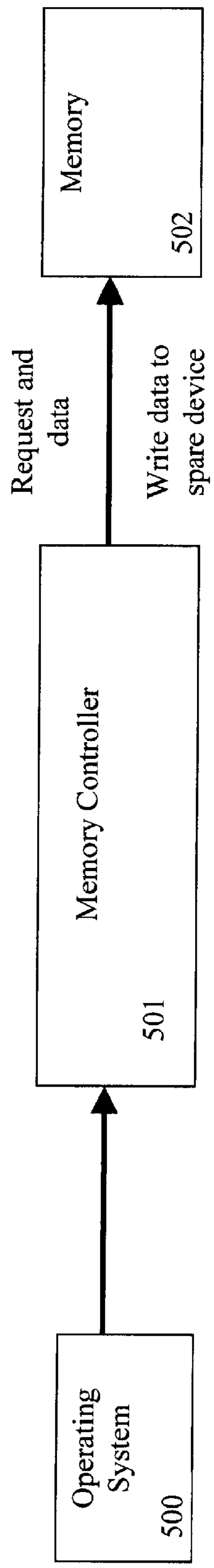
FIG. 6 is a block diagram of a system illustrating an operating system executing a copy between memory devices to be swapped according to one embodiment of the present invention.
Figure 7:
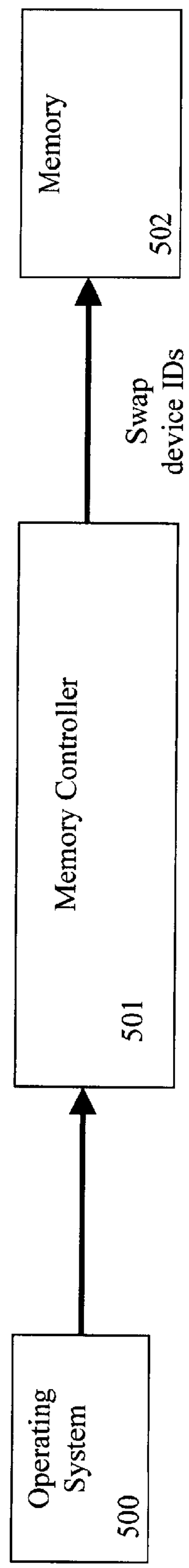
FIG. 7 is a block diagram of a system illustrating an operating system swapping the device IDs of memory devices according to one embodiment of the present invention.

FIGS. 5–7 illustrate one embodiment of the present invention where the memory replacement process is executed by software. FIG. 5 is a block diagram of a system where the operating system 500 initiates a memory replacement by the memory controller 501 according to one embodiment of the present invention. Here, the operating system 500 sends individual read requests for the data contained in the faulty memory range to the memory controller 501.

FIG. 6 is a block diagram of a system where the operating system continues the copy begun in FIG. 5 by writing the data back to the spare device in memory system 502 according to one embodiment of the present invention.

After the copy is finished, the IDs of the memory devices may be swapped. FIG. 7 is a block diagram of a system where the memory controller 501 swaps the device IDs of memory devices according to one embodiment of the present invention. Here, the operating system 500 causes the memory controller 501 to swap the device IDs of the spare device and the faulty device to finish the replacement.

As mentioned above, this software based method suffers from the fact that it depends upon fairly sophisticated operating system software modifications in order to work and may have negative effects upon system performance. A hardware based method is much more efficient than the software method and takes approximately one third as long to perform. A hardware based method also has the advantage of permitting access to other memory devices during the replacement process.

Figures 8, 9, 10:
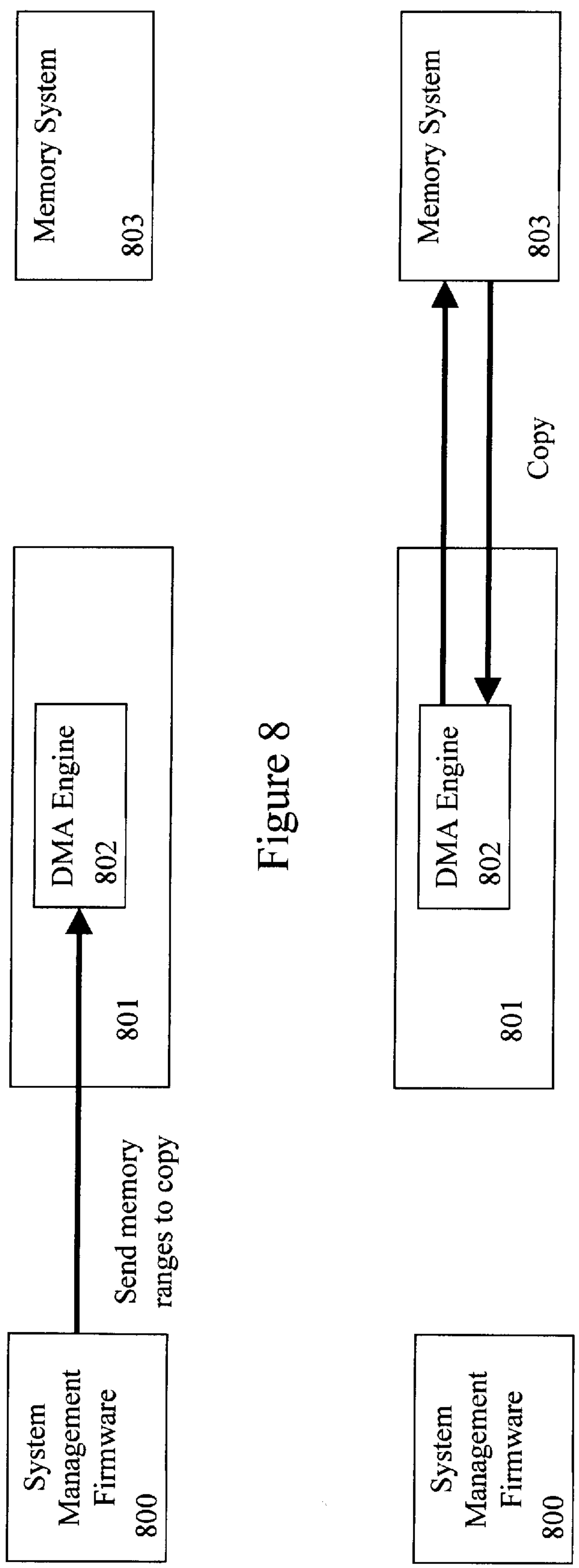
FIG. 8 is a block diagram of a system illustrating system management firmware initiating a memory replacement by a DMA engine according to one embodiment of the present invention.
FIG. 9 is a block diagram of a system illustrating a DMA engine executing a copy between memory devices to be swapped according to one embodiment of the present invention.
FIG. 10 is a block diagram of a system illustrating a DMA engine swapping the device IDs of memory devices according to one embodiment of the present invention.

FIGS. 8–10 illustrate one embodiment of the present invention where the memory replacement process is executed by hardware. FIG. 8 is a block diagram of a system where the processor 800 initiates a memory replacement by a DMA engine 802 according to one embodiment of the present invention. Here, the processor 800 sends the memory ranges to be copied to the memory controller 801 which contains a DMA engine 802. The range data sent from the processor 800 contains the source start address, the source end address, and the destination start address.

FIG. 9 is a block diagram of a system where the DMA engine 802 executes a copy between memory devices to be swapped according to one embodiment of the present invention. Here, the DMA engine 802 copies the contents of the memory 803 from the faulty device to the spare device. The DMA engine 802 copies everything between the source start address and the source end address into memory 803 beginning at the destination start address.

After the copy is finished, the IDs of the memory devices may be swapped. FIG. 10 is a block diagram of a system where the DMA engine 802 swaps the device IDs of memory devices according to one embodiment of the present invention. Here, the DMA engine 802 swaps the device IDs of the spare device and the faulty device to finish the replacement.

Figure 11:
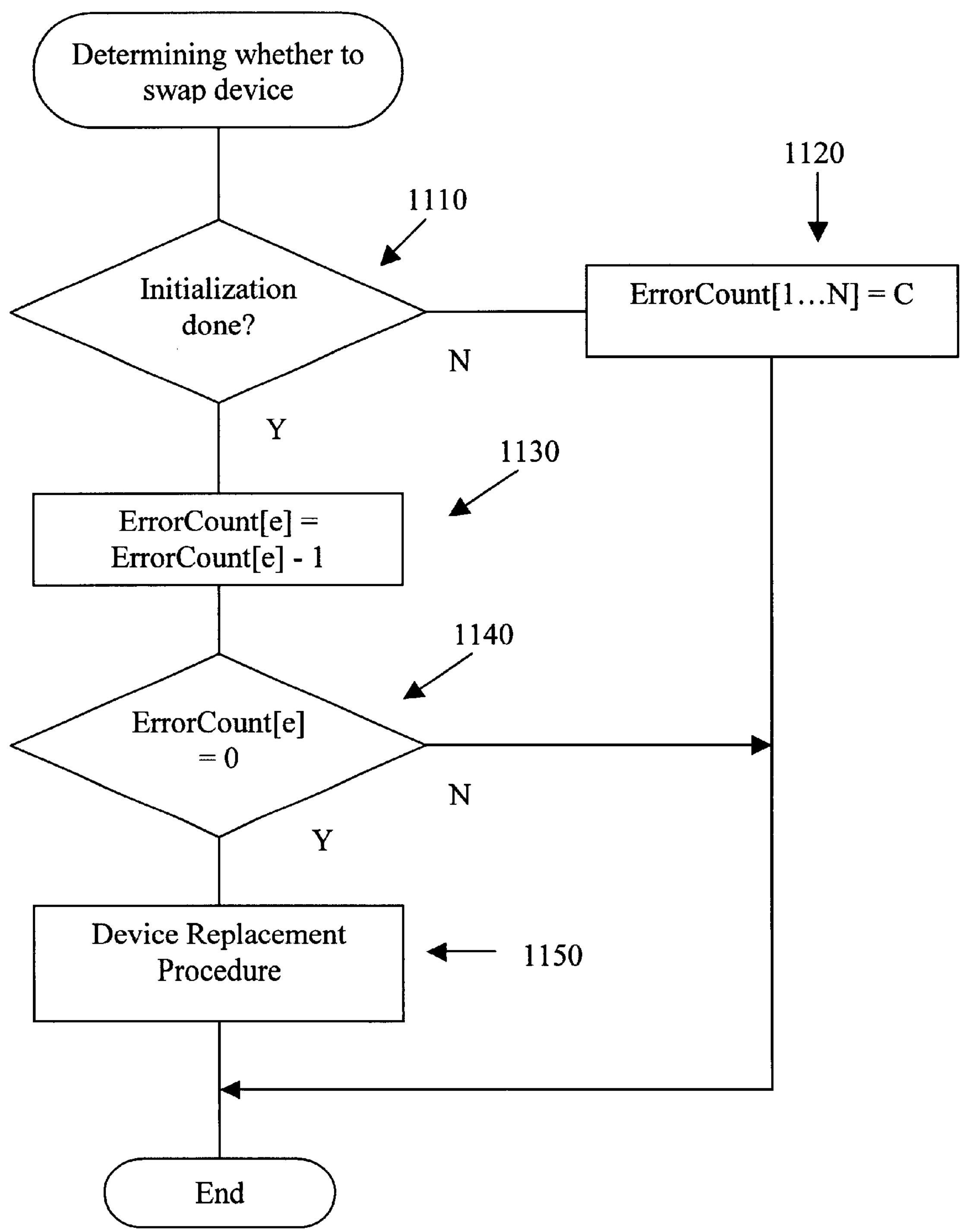
FIG. 11 is a flowchart of one embodiment of the present invention illustrating a method for determining whether to swap memory devices.

FIG. 11 is a flowchart of one embodiment of the present invention illustrating the method for determining whether to swap memory devices. Here, "N" is the number of devices being used, "C" is the maximum number of errors allowed before the device is replaced, and "e" is the ID of the device exhibiting the errors. According to one embodiment of the present invention, this process will be triggered by an interrupt generated by memory error detection logic. First 1110, if the process has not been initialized, for example no errors have occurred since the system was started, the error count for each device is initialized 1120. In this example, this initial value is equal to the maximum number of errors allowed before the device is replaced, C. If initialization has been completed, the error count for the device that caused the interrupt is decremented by one 1130. This process is repeated after each interrupt from the memory error detection logic. Once the error count has been decremented to 0 1140 the device is considered to be faulty and the device replacement procedure is started 1150.

Figure 12:
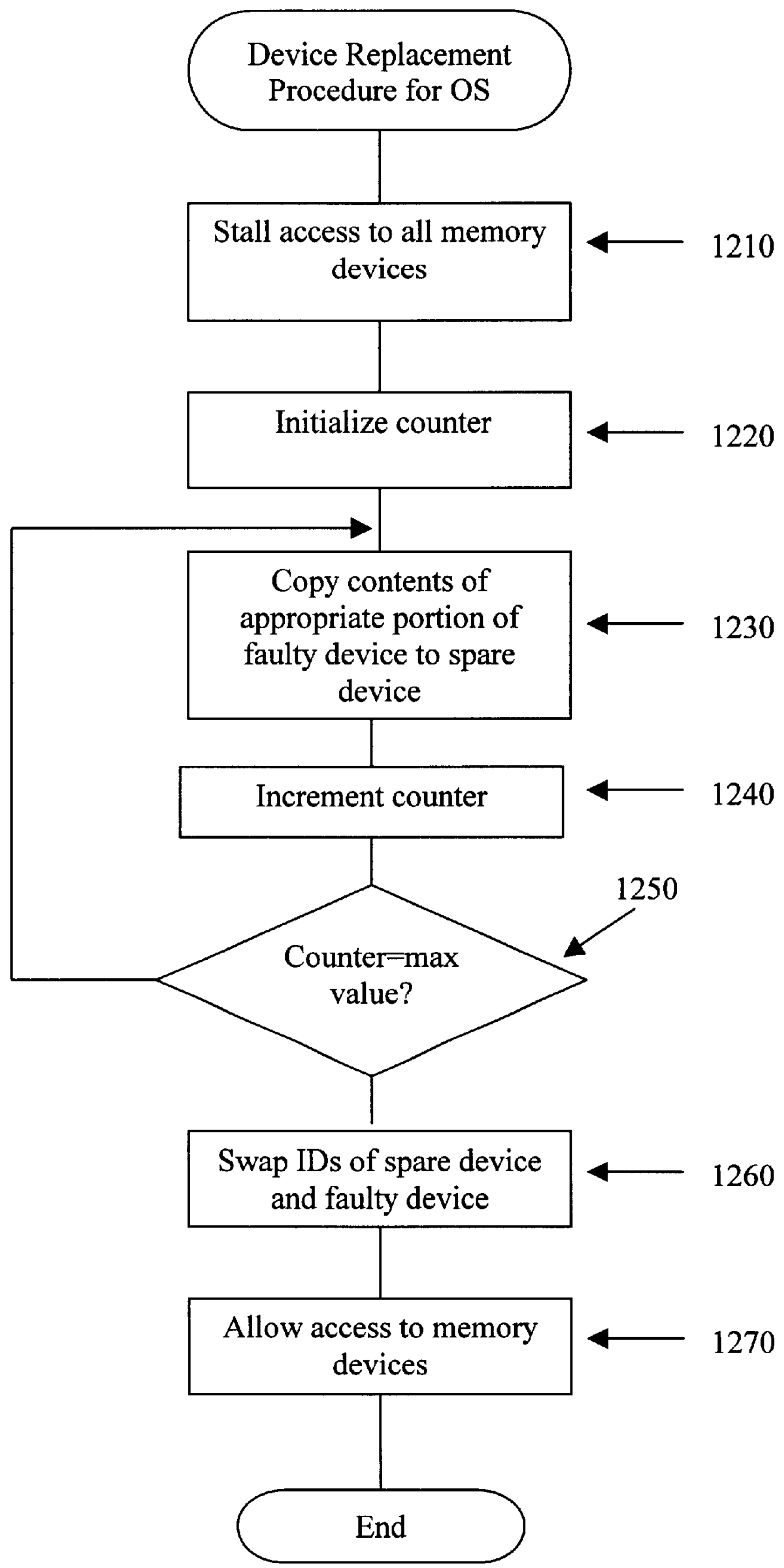
FIG. 12 is a flowchart of one embodiment of the present invention illustrating a device replacement procedure executed by the operating system.

FIG. 12 is a flowchart of one embodiment of the present invention illustrating a device replacement procedure executed by the operating system. First 1210, access to all memory devices is blocked. Next 1220, a counter is initialized. The content of the faulty device is then copied to the spare device 1230 a portion at a time. The size of these portions may vary. The portions may be a single byte, a whole data word or several words to name a few examples. The counter is then incremented and the copying process is repeated until the counter equals the maximum value, 1240–1250. This maximum value can vary depending on the size of the memory device being replaced and the size of the block copied in each operation. Next 1260, the IDs of the faulty device and the spare device are swapped. Finally 1270, access to the memory is allowed.

As mentioned above, this software based method suffers from the fact that it depends upon fairly sophisticated operating system software modifications in order to work and may have negative effects upon system performance. A hardware based method is much more efficient than the software method and takes approximately one third as long to perform. A hardware based method also has the advantage of being able to allow access to other memory devices in parallel with the replacement process.

Figure 13:
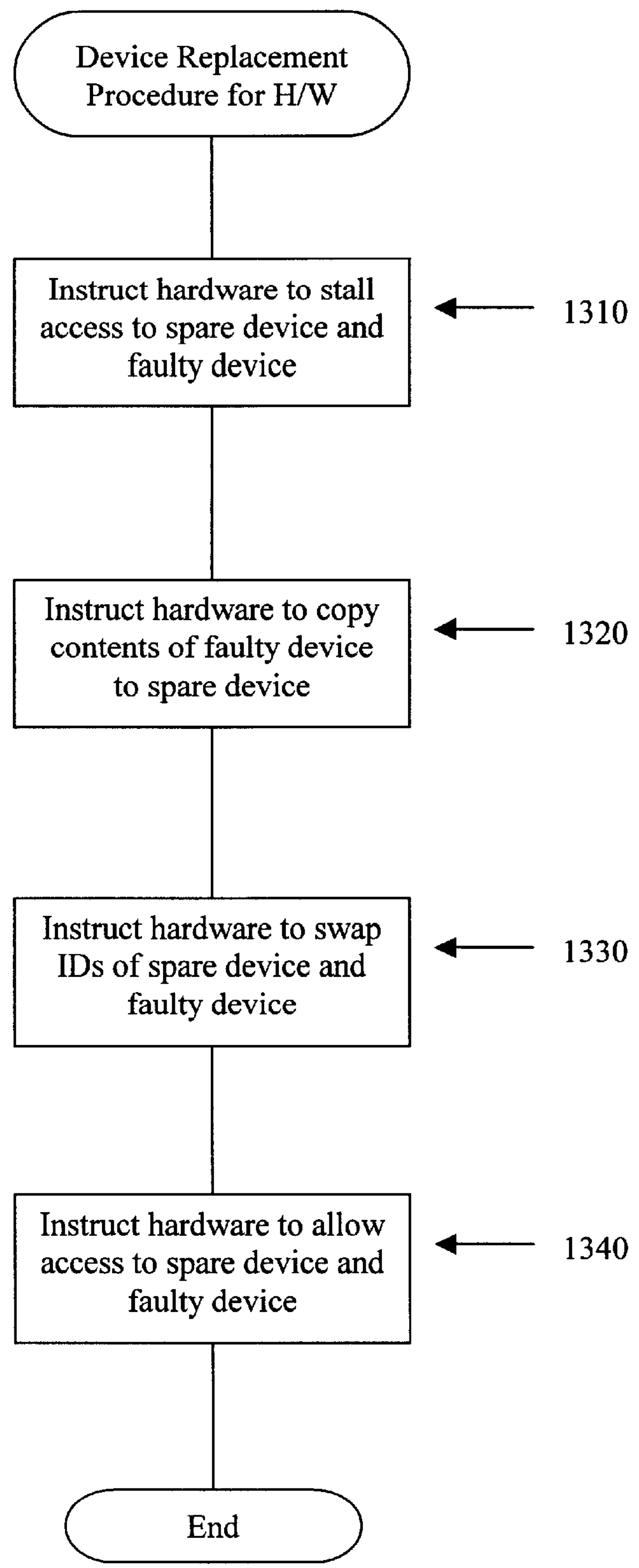
FIG. 13 is a flowchart of one embodiment of the present invention illustrating a device replacement procedure executed by system management firmware.

FIG. 13 is a flowchart of one embodiment of the present invention illustrating a device replacement procedure executed by system management firmware. First 1310, access to the two devices to be swapped is blocked. Hardware is instructed to copy the content of the faulty device to the spare device 1320. Next 1330, hardware is instructed to swap the IDs of the faulty device and the spare device. Finally 1340, access to the two devices is allowed.

Following device replacement, a check of the replaced device can be done to determine if the device is actually failing and to determine the suitability of the device for use as a spare. According to the preferred embodiment of the present invention, this check can be done by a simple DMA engine. In an alternative embodiment of the present invention this check can be performed by the operating system. Further, by performing the check at the lowest possible priority level, the impact on system performance can be minimized.

Figure 14:
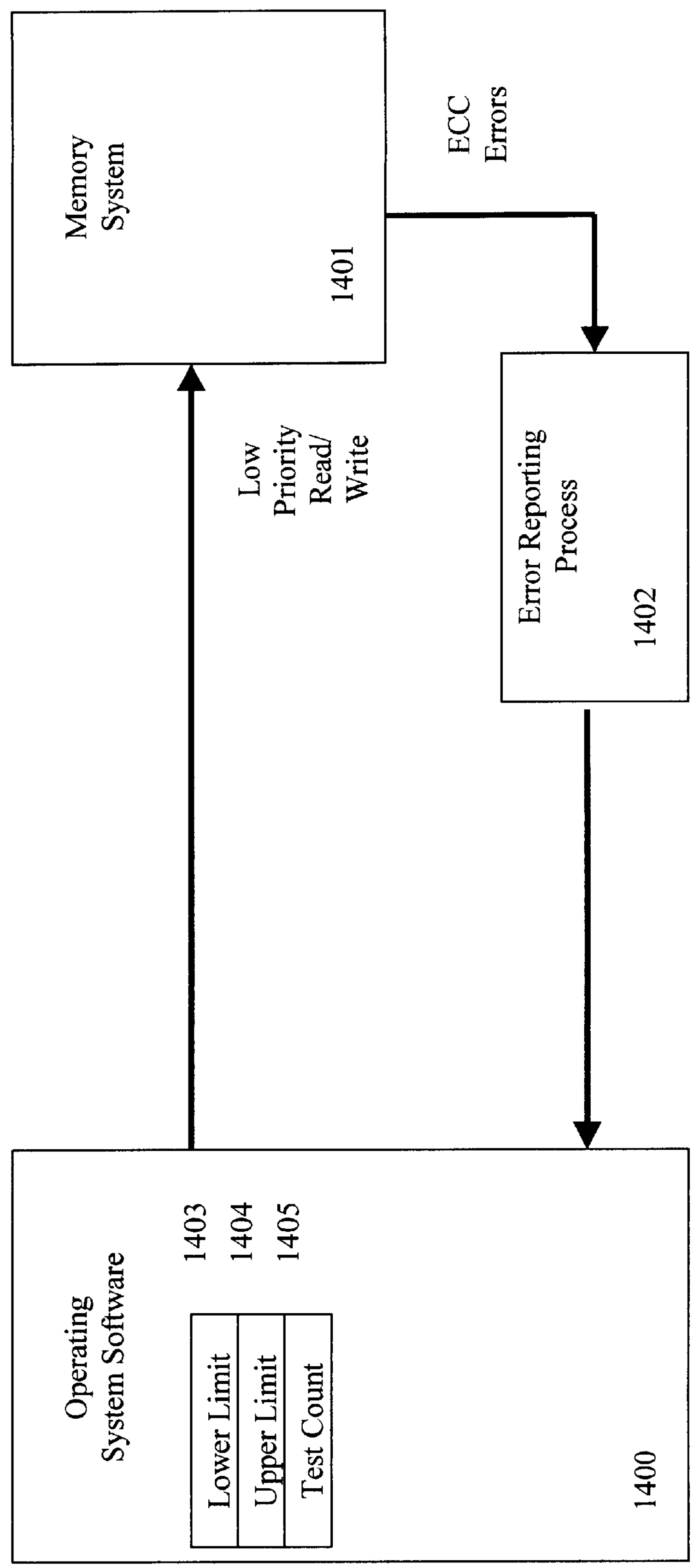
FIG. 14 is a block diagram of a system illustrating an operating system performing a check of replaced memory devices according to one embodiment of the present invention.

FIG. 14 is a block diagram of a system where the operating system 1400 performs a check of replaced memory devices according to one embodiment of the present invention. Here, the operating system 1400 performs repeated low priority reads and writes to the memory system 1401 beginning at the lower address 1403 of the memory range to be tested and proceeding to the upper address 1404 of the range to be tested. The test is repeated a predetermined number of times 1405. If the tests are completed the specified number of times without errors, the device is determined to be suitable for use as a spare. Any errors which occur are passed through the error reporting hardware 1402 to the operating system, 1400, for logging.

As with the device replacement methods, this software based checking method suffers from the fact that it depends upon fairly sophisticated operating system software modifications in order to work and may have negative effects upon system performance. A hardware based method is much more efficient than a software method and can, with little impact on system performance, check a device while the system operates normally.

Figure 15:
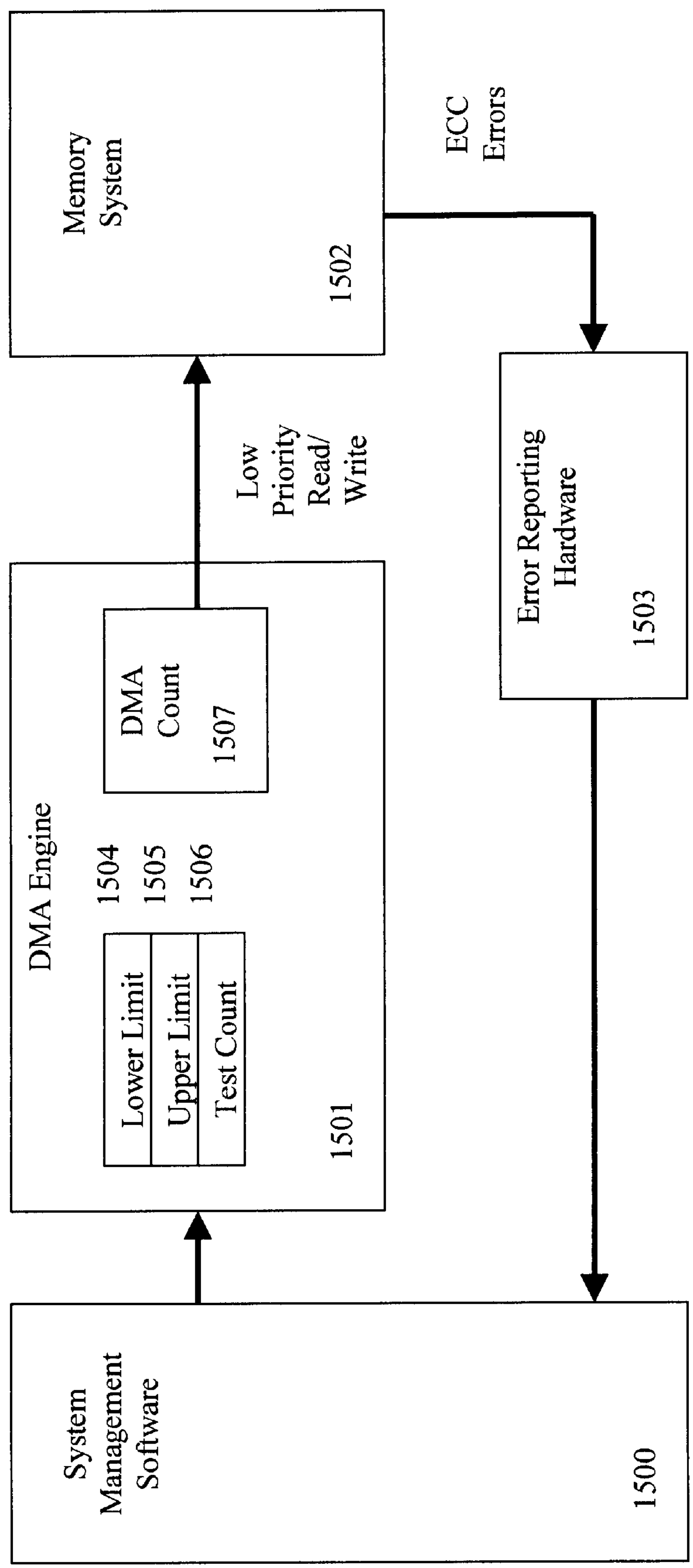
FIG. 15 is a block diagram of a system illustrating a DMA engine performing a check of replaced memory devices according to one embodiment of the present invention.

FIG. 15 is a block diagram of a system where a DMA engine 1501 performs a check of replaced memory devices according to one embodiment of the present invention. Here, the system management firmware 1500 instructs the DMA engine 1501 to begin the check. The DMA engine 1501 performs repeated low priority reads and writes to the memory system 1502 beginning at the lower address 1504 of the memory range to be tested and proceeding to the upper address 1505 of the range to be tested. During this process, the DMA count 1507 tracks the test position within the range of addresses to be tested. The test is repeated a predetermined number of times 1506. If the tests is completed the specified number of times without errors, the device is determined to be suitable for use as a spare. Any errors which occur are passed through the error reporting hardware 1503 to the system management firmware, 1500, for logging.

Figure 16:
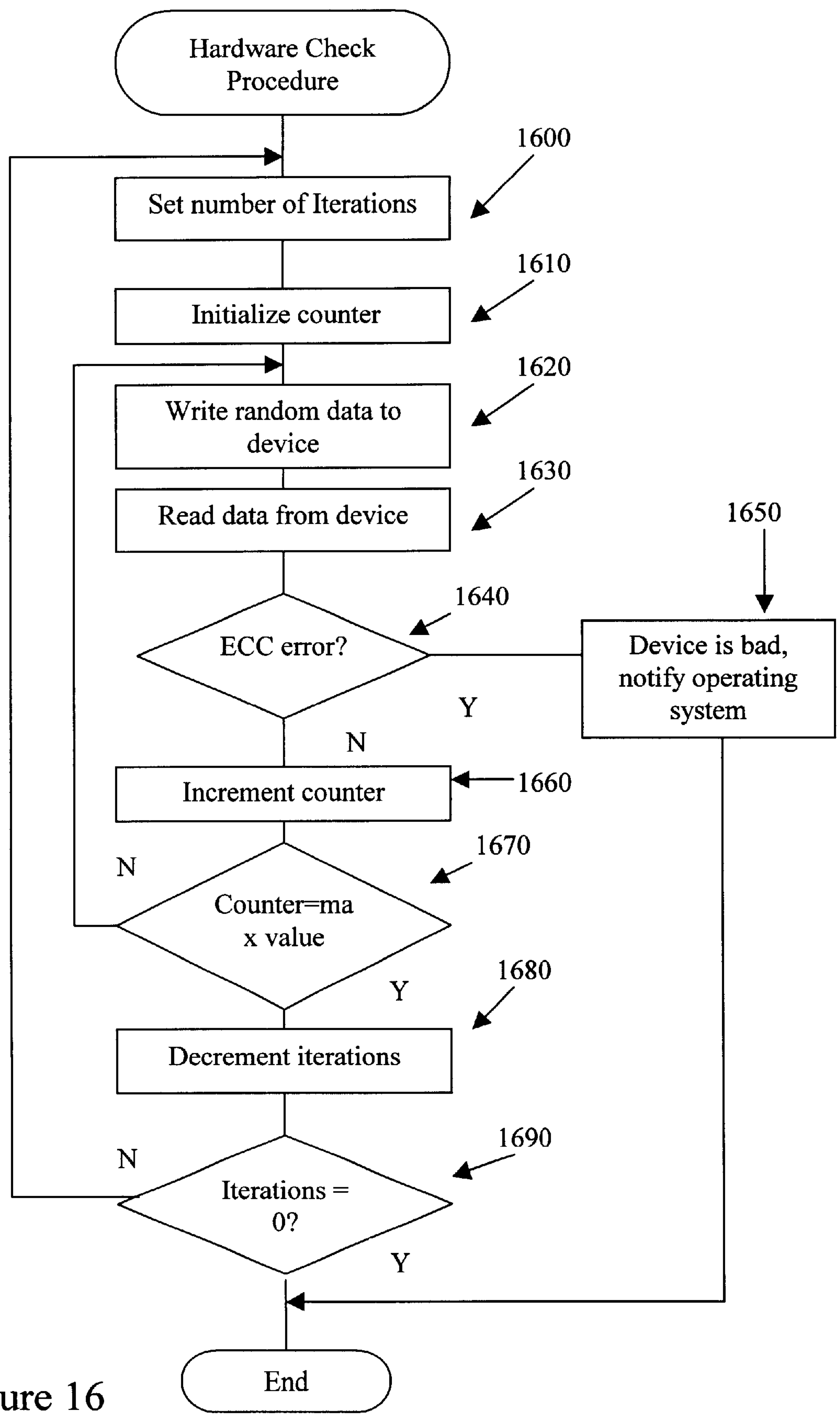
FIG. 16 is a flowchart of one embodiment of the present invention illustrating a memory check procedure.

FIG. 16 is a flowchart of one embodiment of the present invention illustrating a hardware check procedure. First 1600, the number of iterations is set to an integer value that is equal to the number of times the device should be checked before being declared usable. Next 1610, a counter is initialized. Random data is then written to the device 1620. This data is then read from the device 1630. If an ECC error occurs the device is considered to be bad and the operating system is notified that the device is actually faulty 1650. If no errors occur, the counter is incremented and the process repeated for all blocks in the device 1660–1670. Once all blocks have been tested in this manner, the number of iterations is decremented and the test repeated up to the number of times required 1680–1690.

What is claimed is:

1. A method, comprising:

stalling access to a faulty memory device and to a spare memory device;

copying contents of the faulty memory device to the spare memory device;

swapping the faulty memory device with the spare memory device by assigning a device identifier of the faulty memory device to the spare memory device, and hiding the faulty memory device; and allowing access to the spare memory device.

2. The method of claim 1, wherein copying comprises copying by system management firmware.

3. The method of claim 1, wherein copying comprises copying by an operating system.

4. The method of claim 1, further comprises determining whether to perform stalling, copying, swapping, and allowing if a number of errors generated by a device exceeds a predetermined threshold.

5. The method of claim 4, further comprises detecting the number of errors based on interrupts generated by a memory error detection unit.

6. The method of claim 1, wherein the faulty memory device comprises a memory module.

7. The method of claim 6, wherein the memory module comprises a RAMBUS Inline Memory Module (RIMM).

8. The method of claim 1, wherein the faulty memory device comprises a memory device within a memory module.

9. The method of claim 8, wherein the memory device comprises a RAMBUS Dynamic Random Access Memory (RDRAM).

10. The method of claim 1, wherein the faulty memory device comprises a portion of memory within a memory device.

11. The method of claim 1, further comprises automatically testing the faulty memory device.

12. The method of claim 11, further comprising:

writing a pseudo-random value into the faulty memory device;

reading the pseudo-random value from the faulty memory device;

repeating writing and reading according to a predetermined criteria; and determining suitability of the faulty memory device for use as a spare based on a number of errors identified during the repetitive writing and reading.

13. The method of claim 12, where testing comprises testing by hardware and system management firmware.

14. The method of claim 12, where testing comprises testing by system management firmware.

15. The method of claim 12, where testing comprises testing at the lowest possible priority level.

16. The method of claim 12, where testing comprises testing on a memory module.

17. The method of claim 12, where testing comprises testing on a memory device within a memory module.

18. The method of claim 12, where testing comprises testing on a portion of memory within a memory device.

19. The method of claim 1, wherein copying comprises copying by hardware.

20. The method of claim 1, wherein swapping comprises swapping by system management firmware.

21. The method of claim 1, wherein swapping comprises swapping by hardware.

22. The method of claim 1, wherein swapping comprises swapping by an operating system.

23. A system, comprising:

a memory coupled with a processor, the memory having one or more inline memory modules, each of the one or more inline memory modules having a plurality of memory devices, at least one of the plurality of memory devices serving as a spare memory device; and a memory controller coupled with the processor and the memory, the memory controller having a direct memory access (DMA) engine to copy data between two or more of the plurality of memory devices and manage device identifiers associated with the plurality of memory devices; the memory controller to replace a faulty memory device of the plurality of memory devices with the spare memory device in response to a command from the system management firmware by copying contents of the faulty memory device to the spare memory device; and the DMA engine to swap the faulty memory device with the spare memory device by assigning a device identifier of the faulty memory device to the spare memory device and hiding the faulty memory device, to stall access to the faulty memory device and the spare memory device, and to allow access to the spare memory device.

24. The system of claim 23, wherein the DMA engine is further to:

write a pseudo-random value into the faulty memory device;

read the pseudo-random value from the faulty memory device;

repeat write and read according to a predetermined criteria; and determine suitability of the faulty memory device for use as a spare based on a number of errors identified during the repetitive write and read.

25. The system of claim 23, wherein the faulty memory device comprises a memory module.

26. The system of claim 25, wherein the memory module comprises a RAMBUS Inline Memory Module (RIMM).

27. The system of claim 23, wherein the faulty memory device comprises a memory device within a memory module.

28. The system of claim 27, wherein the memory device comprises a RAMBUS Dynamic Random Access Memory (RDRAM).

29. The system of claim 23, wherein the faulty memory device comprises a portion of memory within a memory device.

30. An apparatus, comprising:

a processor coupled with a memory having a faulty memory device and a spare memory device, the processor to copy contents of the faulty memory device to the spare memory device and to manage device identifiers associated with the faulty memory device and the spare memory device; and a memory controller coupled with the processor and the memory; the memory controller to replace the faulty memory device with the spare memory device in response to a command from the operating system; and the processor to swap the faulty memory device with the spare memory device by assigning a device identifier of the faulty memory device to the spare memory device and hiding the faulty memory device, to stall access to both the faulty memory device and the spare memory device, and to allow access to the spare memory device.

31. The apparatus of claim 30, wherein the operating system is further to:

write a pseudo-random value into the faulty memory device;

read the pseudo-random value from the faulty memory device;

repeat write and read according to a predetermined criteria; and determine suitability of the faulty memory device for use as a spare based on the occurrence of errors during the repetitive write and read.

32. A machine readable medium having stored thereon data representing sets of instructions, the sets of instructions which, when executed by a machine, cause the machine to:

stall access to a faulty memory device and a spare memory device;

copy contents of the faulty memory device to the spare memory device;

swap the faulty memory device with the spare memory device by assigning a device identifier of the faulty memory device to the spare memory device, and hiding the faulty memory device; and allow access to the spare memory device.

33. The machine readable medium of claim 32, wherein the sets of instructions which, when executed by the machine, further cause the machine to:

write a pseudo-random value into the faulty memory device;

read the pseudo-random value from the faulty memory device;

repeat write and read according to a predetermined criteria; and determine suitability of the faulty memory device for use as a spare based on a number of errors during the repetitive write and read.

34. The machine-readable medium of claim 32, wherein the sets of instructions, when executed by the machine, further cause the machine to copy by hardware and system management firmware.

35. The machine-readable medium of claim 32, wherein the sets of instructions, when executed by the machine, further cause the machine to copy by an operating system.

* * * * *